US012677636B2

(12) United States Patent
Thanu et al.

(10) Patent No.: US 12,677,636 B2
(45) Date of Patent: Jul. 7, 2026

(54) ELECTROSTATIC END EFFECTOR FOR MANUFACTURING SYSTEM ROBOT

(71) Applicant: APPLIED MATERIALS, INC., Santa Clara, CA (US)

(72) Inventors: Rajkumar Thanu, Santa Clara, CA (US); Pei-Chen Wu, Cupertino, CA (US); William Laceky, Georgetown, TX (US); Matvey Farber, Redwood City, CA (US); Jeffrey C. Hudgens, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1085 days.

(21) Appl. No.: 17/554,404

(22) Filed: Dec. 17, 2021

(65) Prior Publication Data

US 2023/0197498 A1 Jun. 22, 2023

(51) Int. Cl.
*H10P 72/76* (2026.01)
*B25J 11/00* (2006.01)
(Continued)

(52) U.S. Cl.
CPC ....... *H10P 72/7602* (2026.01); *B25J 11/0095* (2013.01); *B25J 15/0019* (2013.01); *B25J 15/0085* (2013.01); *H10P 72/3302* (2026.01)

(58) Field of Classification Search
CPC .......... H01L 21/68707; H01L 21/67742; B25J 11/0095; B25J 15/0019; B25J 15/0085
See application file for complete search history.

(56) References Cited

U.S. PATENT DOCUMENTS 8,599,531 B2 * 12/2013 Sundar ................ H01L 21/6833
414/800
2013/0033690 A1 2/2013 Helmus et al.
(Continued)

FOREIGN PATENT DOCUMENTS

CN 109375474 A 2/2019
JP H06216219 A 8/1994
(Continued)

OTHER PUBLICATIONS

International Search Report and Written Opinion for the International Application No. PCT/US2022/053222, mailed on May 2, 2023, 10 pages.
(Continued)

*Primary Examiner* — Crystal L Hammond
*Assistant Examiner* — Samantha L Faubert
(74) *Attorney, Agent, or Firm* — Lowenstein Sandler LLP

(57) ABSTRACT

Disclosed herein are embodiments of an electrostatic end effector, and methods of manufacturing the same. In one embodiment, an electrostatic end effector comprises a ceramic base, a first electrode layer coupled to the ceramic base, and a second electrode layer coupled to the ceramic base. The electrostatic end effector is configured to generate an electrostatic force upon a substrate responsive to a voltage applied to the first electrode. The electrostatic force upon the substrate may increase the friction force upon the substrate which may allow the end effector to accelerate at faster rates than current technologies allow without the substrate slipping on the end effector.

20 Claims, 9 Drawing Sheets

(51) Int. Cl.
    B25J 15/00      (2006.01)
    H10P 72/30     (2026.01)

(56) References Cited

U.S. PATENT DOCUMENTS

| | | |
|---|---|---|
| 2020/0303229 A1 | 9/2020 | Ozaki et al. |
| 2020/0303231 A1 | 9/2020 | Sasaki et al. |
| 2021/0013081 A1 | 1/2021 | Kosakai et al. |
| 2021/0074521 A1 | 3/2021 | Momiyama et al. |
| 2022/0340695 A1* | 10/2022 | Rasmussen ............. C08F 20/06 |

FOREIGN PATENT DOCUMENTS

| | | | |
|---|---|---|---|
| JP | 4890421 B2 | 3/2012 | |
| JP | 2013062485 A | 4/2013 | |
| JP | 2013235991 A | 11/2013 | |
| JP | 5841329 B2 * | 1/2016 | ............. C04B 37/00 |
| JP | 2020035905 A | 3/2020 | |
| JP | 2020161801 A | 10/2020 | |
| JP | 2021040110 A | 3/2021 | |
| WO | 2012014442 A1 | 2/2012 | |
| WO | 2016194336 A1 | 12/2016 | |
| WO | 2019189600 A1 | 10/2019 | |

OTHER PUBLICATIONS

Extended European Search Report for European Application No.
22908507.1, mailed Oct. 24, 2025, 10 Pages.

* cited by examiner

510 — Provide a ceramic blank

520 — Perform a material removal process to generate one or more features on a top surface 530 — Deposit a cathode layer onto a top surface 540 — Deposit a dielectric layer on top of the cathode layer 550 — Deposit an anode layer on top of a portion of the dielectric layer Finish

600

610 — Provide multiple ceramic sheets

620 — Generate a set of laminated layers by performing a lamination process to combine one or more electrode layers with multiple ceramic sheets 630 — Generate a set of sintered layers by performing a sintering process to combine the laminated layers 640 — Grind a top surface 650 — Polish a top surface Finish

ELECTROSTATIC END EFFECTOR FOR MANUFACTURING SYSTEM ROBOT

TECHNICAL FIELD

Embodiments of the present disclosure relate, in general, to methods of manufacture and design parameters for an electrostatic end effector for a semiconductor manufacturing system robot.

BACKGROUND

An electronic device manufacturing system may include one or more tools or components for transporting and manufacturing substrates. An electronic device manufacturing system may employ a robot apparatus (e.g., a transfer chamber robot, a factory interface robot) to transfer substrates from one location to another. For example, the transfer chamber robot may be configured to transport substrates between a load lock and the process chambers. The robot apparatus may have one or more end effectors which handle the substrates as the substrates are transferred between locations.

Some current robot end effectors rely on static friction between the end effector and the substrate to enable transportation of the substrate on the end effector by the robot. Thus, the robot is limited in its peak end effector acceleration to approximately 0.1 G (a tenth of the acceleration of gravity). If the end effector accelerates beyond the limit allowed by the force of static friction between the end effector and the substrate, the substrate may slide on the end effector, compromising substrate placement and manufacturing processes. Even a small amount of substrate displacement may cause particles to be scraped off the substrate, leading to contamination. Accordingly, improved end effectors for transporting substrates with increased speed efficiency are sought.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

In an aspect of the disclosure, an electrostatic end effector includes a ceramic base, a first electrode layer coupled to the ceramic base, and a second electrode layer coupled to the ceramic base. The electrostatic end effector is configured to generate an electrostatic force upon a substrate responsive to a voltage applied to the first electrode.

In another aspect of the disclosure, a method of manufacturing an electrostatic end effector includes providing a ceramic blank. The method further includes performing a material removal process on the ceramic blank to generate one or more features on a top surface of the ceramic blank. The method further includes depositing a cathode layer onto at least a top surface of the ceramic blank. The method further includes depositing a dielectric layer on top of at least the cathode layer. The method further includes depositing an anode layer on top of at least a portion of the dielectric layer.

In another aspect of the disclosure, a method of manufacturing an electrostatic end effector includes providing a plurality of ceramic sheets. The method further includes generating a set of laminated layers by performing a lamination process to combine one or more electrode layers with the plurality of ceramic sheets. The method further includes generating a set of sintered layer by performing a sintering process to combine the laminated layers. The method further includes grinding at least a top surface of the sintered layers. The method further includes polishing at least the top surface of the sintered layers.

BRIEF DESCRIPTION OF DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

FIG. 1 is a top schematic view of an example manufacturing system, according to certain embodiments.

DETAILED DESCRIPTION OF EMBODIMENTS

Figure 2A:
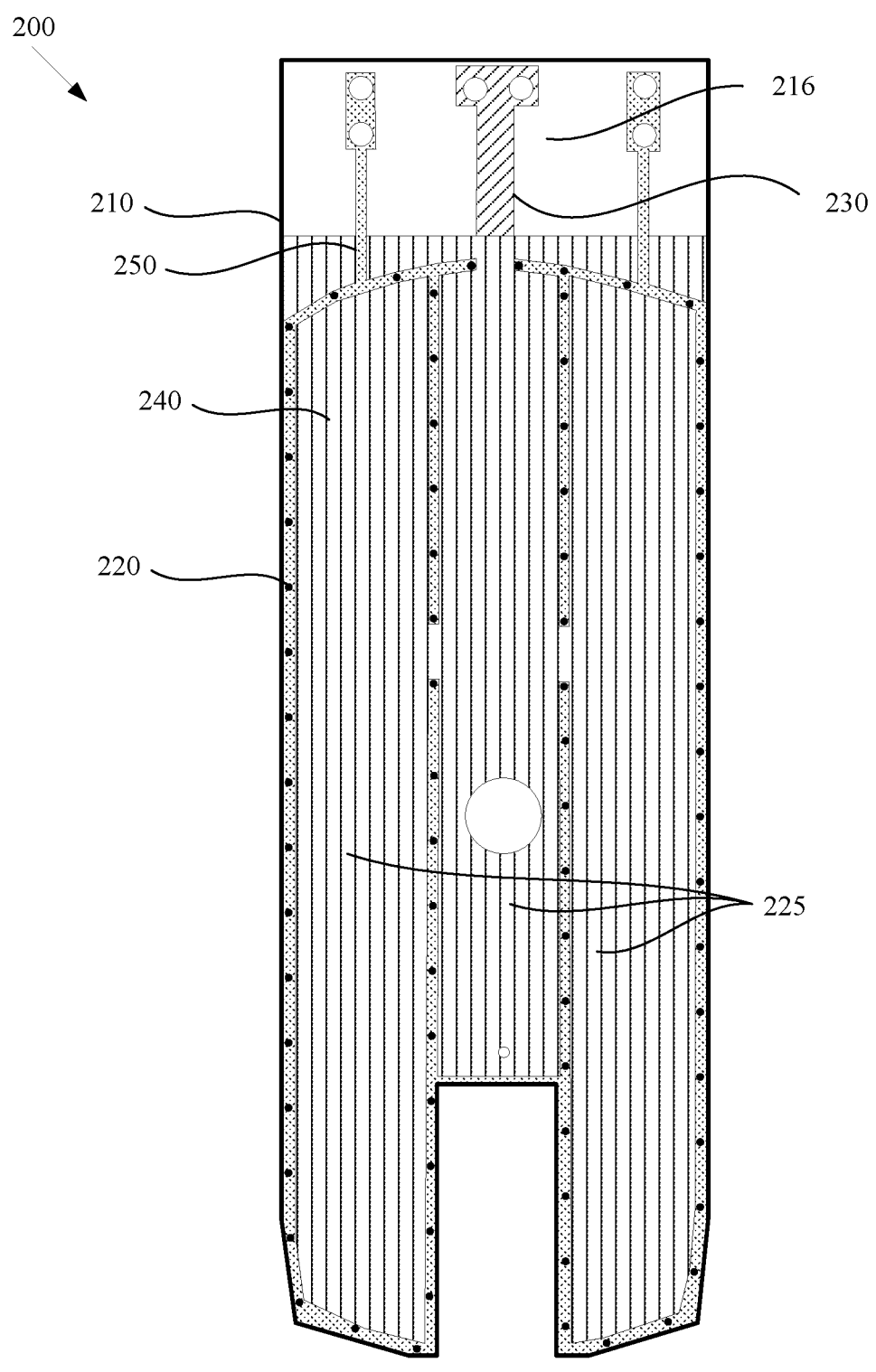
FIG. 2A is a top schematic view of a monopolar electrostatic end effector, according to certain embodiments.

Described herein are technologies directed to an electrostatic robot end effector configured to transfer substrates in an electronic device manufacturing system. An electronic device manufacturing system may perform one or more processes upon a substrate in one or more process chambers. An electronic device manufacturing system may include a transfer chamber positioned proximate to the one or more process chambers. The transfer chamber may include a robot having one or more end effectors upon which a substrate may be positioned whilst the substrate is transferred between one or more process chambers by the robot. Additionally, an electronic device manufacturing system may include a factory interface robot proximate to a factory interface. The factory interface robot may include a robot having one or more end effectors upon which a substrate may be positioned whilst the substrate is transferred from or to the factory interface. Existing robot end effectors rely on static friction between the end effector and the substrate to enable transportation of the substrate, thus limiting the acceleration of the end effector. Accelerating the end effector beyond the static friction limit may compromise substrate placement and cause contamination from scraped off particles, which may result in defective and unusable substrates.

Embodiments of the present disclosure are directed to an electrostatic end effector for a semiconductor manufacturing system robot. In some embodiments, the robot end effector described herein may include an anode and a cathode. The anode and the cathode may be substantially coplanar. For example, the anode and cathode may be disposed substantially within the same plane. Additionally, the anode and the cathode may be separated by one or more dielectric layers. When a substrate is positioned on the end effector, a voltage may be applied to the cathode. The anode may be grounded. In some embodiments, the applied voltage may be monopolar, but may be bipolar in other embodiments. The applied voltage may create an attractive electrostatic force between the end effector and the substrate. The attractive force may increase the static friction between the end effector and the substrate, allowing the end effector to accelerate at faster rates than end effectors relying solely on static friction while transferring the substrate without the substrate slipping.

A first method of manufacturing the robot end effector of the present disclosure may include providing a ceramic blank. In some embodiments, the ceramic blank is machined from stock. The ceramic blank may be machined from alumina (i.e., aluminum oxide), one or more other ceramic materials of suitable characteristics, or any combination thereof. The ceramic blank may have a flat top surface. The method may further include material removal operations on at least the top surface of the ceramic blank in controlled locations. In some embodiments, the ceramic blank is micro-bead blasted. The material removal process may generate multiple pillars and valleys upon the top surface of the end effector. The multiple pillars may be small, substantially cylindrical protrusions protruding from the top surface of the end effector. The multiple pillars may be arranged in a pattern on the top surface of the end effector. In some embodiments, the multiple pillars are substantially arranged in rows on the top surface of the end effector. The one or more valleys may be depressions in the top surface of the end effector. The one or more valleys may be longer than they are wide. In some embodiments, the one or more valleys separate one or more rows of pillars. One or more layers may then be deposited on at least the top surface of the end effector. In some embodiments, the one or more layers are deposited via a physical vapor deposition process (PVD). A first layer deposited upon a top surface of the end effector may be a cathode layer. A second layer may be a dielectric layer. A third layer may be an anode layer. In some embodiments, the anode layer may be a ground layer. The anode layer may be deposited upon at least the tops of the pillars, on top of the dielectric layer. When in use, the substrate may be positioned on the anode layer on the top of the pillars. In some embodiments, each of the one or more layers may be approximately 10 μm. However, a range of layer thicknesses may be used to construct the end effector in a manner that will provide a sufficient attractive electrostatic force between the end effector and the substrate.

A second method of manufacturing the electrostatic end effector of the present disclosure may include first machining multiple ceramic sheets. In some embodiments, the ceramic sheets are fabricated from alumina. One or more electrode layers may be combined with the multiple ceramic sheets using a lamination process. In some embodiments, the end effector includes a first electrode layer and a second electrode layer which are coplanar and electrically insulated from one another. In other embodiments, the end effector includes a first electrode layer disposed below a second electrode layer. The one or more electrode layers may be comprised of a conductive material. For example, the one or more electrode layers may be platinum. The method may further include generating a set of sintered layers by performing a sintering process to combine the laminated layers into a rough end effector. The sintering process may include heating the laminated layers sufficiently so that the layers coalesce into a single mass. The method may further include grinding the top surface of the end effector to flatten said surface. The method may further include polishing the top surface of the end effector. In some embodiments, the polishing is may be performed by a lapping process. In some embodiments, the lapping process is a polishing process. For example, a lapping process may be achieved by rubbing a tool surface against the top surface of the end effector with fine abrasives in between. The lapping process may include using a fine abrasive on the top surface of the end effector to further flatten and polish said surface. When in operation, a substrate may be positioned upon the top surface of the end effector. A voltage may be applied to the second electrode layer, whilst the first electrode layer is grounded. This may generate an electrostatic force between the end effector and the substrate, causing an increase in static friction between the substrate and the end effector.

In some embodiments, the second method of manufacturing further includes a material removal operation performed on the top surface of the end effector. In some embodiments, the material removal operation is a micro-bead blasting process. The micro-bead blasting process may include applying micro-abrasives to the top surface of the end effector at high pressure to remove material from the surface of the end effector. The micro-abrasives may be small glass beads. The material removal operation may generate multiple mesas upon the top surface of the end effector. The multiple mesas may be substantially cylindrical protrusions which protrude from the top surface of the end effector. In some embodiments, a protruded electrode may rise from one or more of the mesas and extend down to the first, lower electrode layer. The one or more protruding electrodes may be electrically connected to the lower electrode layer while being electrically insulated from the upper electrode layer. The one or more protruding electrodes may be made of a conductive material. For example, the one or more protruding electrodes may be made of platinum. When the end effector is in operation, a substrate may be positioned upon the one or more protruding electrodes.

Figure 1:
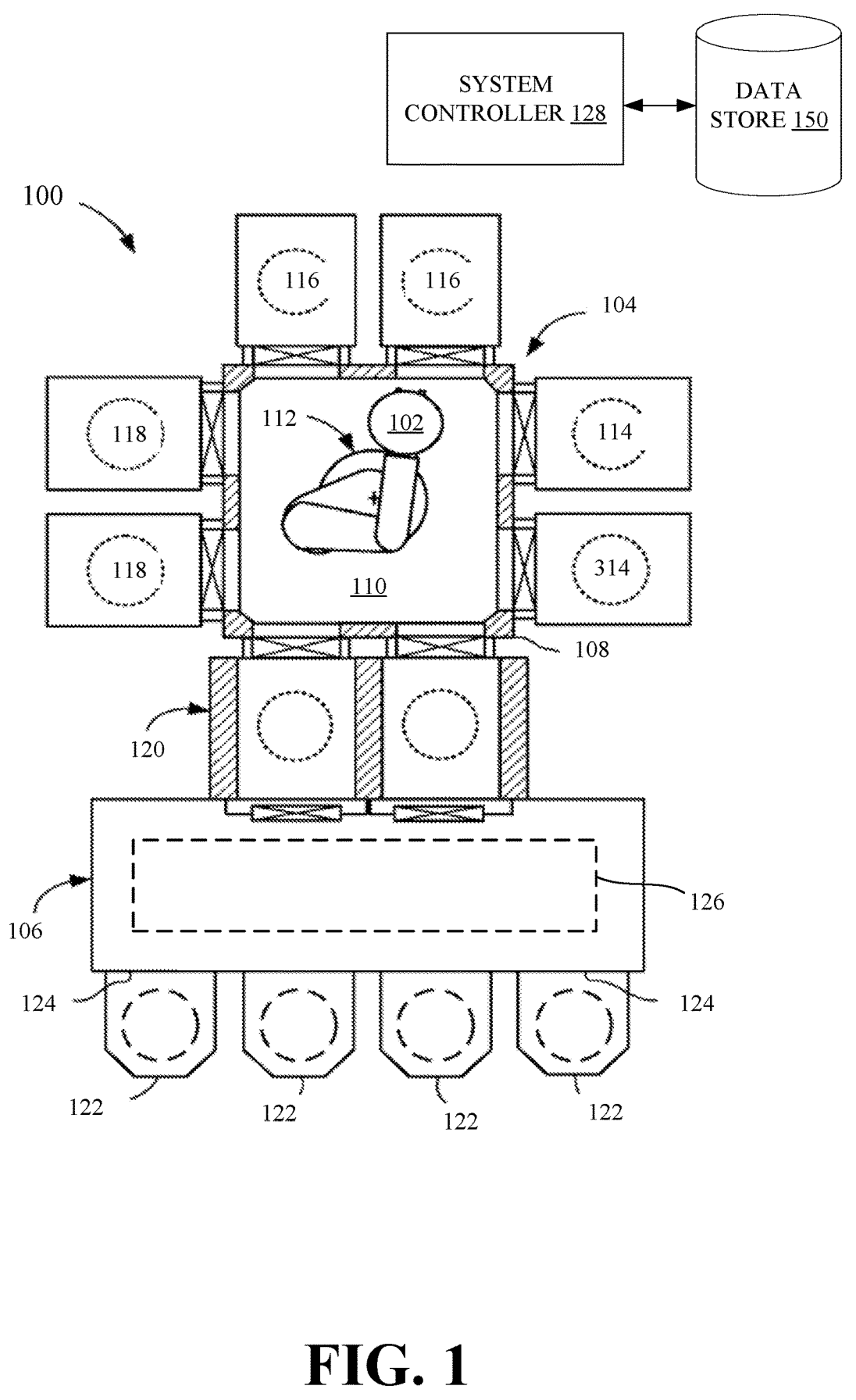

An end effector which applies an attractive force between the end effector and the substrate could allow for an increased acceleration limit of the end effector without the substrate becoming displaced. This in turn could enable increased substrate transfer speeds leading to higher productivity of the manufacturing system FIG. 1 is a top schematic view of an example manufacturing system 100, according to aspects of the present disclosure. Manufacturing system 100 may perform one or more processes on a substrate 102. Substrate 102 may be any suitably rigid, fixed-dimension, planar article, such as, e.g., a silicon-containing disc or wafer, a patterned wafer, a glass plate, or the like, suitable for fabricating electronic devices or circuit components thereon.

Manufacturing system 100 may include a process tool 104 and a factory interface 106 coupled to process tool 104. Process tool 104 may include a housing 108 having a transfer chamber 110 therein. Transfer chamber 110 may include one or more process chambers (also referred to as processing chambers) 114, 116, 118 disposed therearound and coupled thereto. Process chambers 114, 116, 118 may be coupled to transfer chamber 110 through respective ports, such as slit valves or the like. Transfer chamber 110 may also include a transfer chamber robot 112 configured to transfer substrate 102 between process chambers 114, 116, 118, load lock 120, etc. Transfer chamber robot 112 may include one or multiple arms where each arm includes one or more end effectors at the end of each arm. The end effector may be configured to handle particular objects, such as wafers.

Process chambers 114, 116, 118 may be adapted to carry out any number of processes on substrates 102. A same or different substrate process may take place in each processing chamber 114, 116, 118. A substrate process may include atomic layer deposition (ALD), physical vapor deposition (PVD), chemical vapor deposition (CVD), etching, annealing, curing, pre-cleaning, metal or metal oxide removal, or the like. Other processes may be carried out on substrates therein. Process chambers 114, 116, 118 may each include one or more sensors configured to capture data for substrate 102 before, after, or during a substrate process. For example, the one or more sensors may be configured to capture spectral data and/or non-spectral data for a portion of substrate 102 during a substrate process. In other or similar embodiments, the one or more sensors may be configured to capture data associated with the environment within process chamber 114, 116, 118 before, after, or during the substrate process. For example, the one or more sensors may be configured to capture data associated with a temperature, a pressure, a gas concentration, etc. of the environment within process chamber 114, 116, 118 during the substrate process.

A load lock 120 may also be coupled to housing 108 and transfer chamber 110. Load lock 120 may be configured to interface with, and be coupled to, transfer chamber 110 on one side and factory interface 106. Load lock 120 may have an environmentally-controlled atmosphere that may be changed from a vacuum environment (wherein substrates may be transferred to and from transfer chamber 110) to at or near atmospheric-pressure inert-gas environment (wherein substrates may be transferred to and from factory interface 106) in some embodiments. Factory interface 106 may be any suitable enclosure, such as, e.g., an Equipment Front End Module (EFEM). Factory interface 106 may be configured to receive substrates 102 from substrate carriers 122 (e.g., Front Opening Unified Pods (FOUPs)) docked at various load ports 124 of factory interface 106. A factory interface robot 126 (shown dotted) may be configured to transfer substrates 302 between carriers (also referred to as containers) 122 and load lock 120. Carriers 122 may be a substrate storage carrier or a replacement part storage carrier.

Manufacturing system 100 may also be connected to a client device (not shown) that is configured to provide information regarding manufacturing system 100 to a user (e.g., an operator). In some embodiments, the client device may provide information to a user of manufacturing system 100 via one or more graphical user interfaces (GUIs). For example, the client device may provide information regarding a target thickness profile for a film to be deposited on a surface of a substrate 102 during a deposition process performed at a process chamber 114, 116, 118 via a GUI. The client device may also provide information regarding a modification to a process recipe in view of a respective set of deposition settings predicted to correspond to the target profile, in accordance with embodiments described herein.

Manufacturing system 100 may also include a system controller 128. System controller 128 may be and/or include a computing device such as a personal computer, a server computer, a programmable logic controller (PLC), a microcontroller, and so on. System controller 128 may include one or more processing devices, which may be general-purpose processing devices such as a microprocessor, central processing unit, or the like. More particularly, the processing device may be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device may also be one or more special-purpose processing devices such as an application specific integrated circuit (ASIC), a field programmable gate array (FPGA), a digital signal processor (DSP), network processor, or the like. System controller 128 may include a data storage device (e.g., one or more disk drives and/or solid state drives), a main memory, a static memory, a network interface, and/or other components. System controller 128 may execute instructions to perform any one or more of the methodologies and/or embodiments described herein. In some embodiments, system controller 128 may execute instructions to perform one or more operations at manufacturing system 100 in accordance with a process recipe. The instructions may be stored on a computer readable storage medium, which may include the main memory, static memory, secondary storage and/or processing device (during execution of the instructions).

System controller 128 may receive data from sensors included on or within various portions of manufacturing system 100 (e.g., processing chambers 114, 116, 118, transfer chamber 110, load lock 120, etc.). In some embodiments, data received by the system controller 128 may include spectral data and/or non-spectral data for a portion of substrate 102. In other or similar embodiments, data received by the system controller 128 may include data associated with processing substrate 102 at processing chamber 114, 116, 118, as described previously. For purposes of the present description, system controller 128 is described as receiving data from sensors included within process chambers 114, 116, 118. However, system controller 128 may receive data from any portion of manufacturing system 100 and may use data received from the portion in accordance with embodiments described herein. In an illustrative example, system controller 128 may receive data from one or more sensors for process chamber 114, 116, 118 before, after, or during a substrate process at the process chamber 114, 116, 118. Data received from sensors of the various portions of manufacturing system 100 may be stored in a data store 150. Data store 150 may be included as a component within system controller 128 or may be a separate component from system controller 128.

FIG. 2A is a schematic top view of end effector 200, in accordance with embodiments of the present disclosure. End effector 200 may include an end effector base 210, a robot connector 216, pillars 220, a cathode layer 230, a dielectric layer 240, and a ground layer 250. FIG. 2A shows the layers of end effector 200 superimposed upon each other. The layers of end effector 200 are shown separately in FIGS. 3A-D. In some embodiments, the end effector 200 may include one or more sensors.

The end effector base 210 may comprise a ceramic material. In some embodiments, end effector body 210 is alumina ceramic. End effector 200 may be attached to a robot via robot connector 216 by way of one or more fasteners or other connectors. In some embodiments, pillars 220 are arranged along one or more side edges of end effector body 210. In some embodiments, pillars 220 are arranged in lines substantially parallel to a longitudinal axis of the end effector base 210. In some embodiments, the pillars 220 rise approximately 20 μm above a surface of the end effector base 210. Pillars 220 may support a substrate that end effector 200 is transferring or is to transfer. In some embodiments, end effector 200 includes one hundred or more pillars 220. In some embodiments, end effector 200 includes sufficient pillars so that a substrate being carried by end effector 200 flexes minimally when an attractive force is applied between the end effector 200 and the substrate. End effector base 210 may include one or more valleys 225 substantially between one or more rows of pillars 220. The one or more valleys 225 may have been generated by a material removal process. In some embodiments, the same process that generates the pillars 220 also generates the one or more valleys 225. The one or more valleys 225 may be created by a micro-bead blasting process. In some embodiments, the one or more valleys 225 of the end effector base 210 are approximately 40 μm deep.

One or more layers may be deposited upon at least the top surface of end effector 200. The one or more layers may be deposited by one or more deposition processes. In some embodiments, the one or more layers are deposited by a vapor deposition process. In certain embodiments, the one or more layers are deposited by a PVD process. The cathode layer 230 and the ground layer 250 may be made up of a conductive material. The ground layer 250 may be an anode layer. In some embodiments, the cathode layer 230 and the ground layer 250 are a titanium layer deposited by a PVD process. The cathode layer 230 may be applied in the one or more valleys of end effector base 210. Dielectric layer 240 may be deposited on top of the cathode layer 230 (see FIG. 2B). Dielectric layer 240 may comprise a dielectric. In some embodiments, the dielectric layer 240 is a layer of aluminum oxide (AlO). In some embodiments, dielectric layer 240 may be deposited on top of the cathode layer 230 and the pillars 220 (see FIG. 2B). In some embodiments, the ground layer 250 is deposited on top of the dielectric layer 240. In some embodiments, the ground layer 250 is deposited on a top surface of each of the pillars 220 and also forming a conductive path.

Figure 2B:
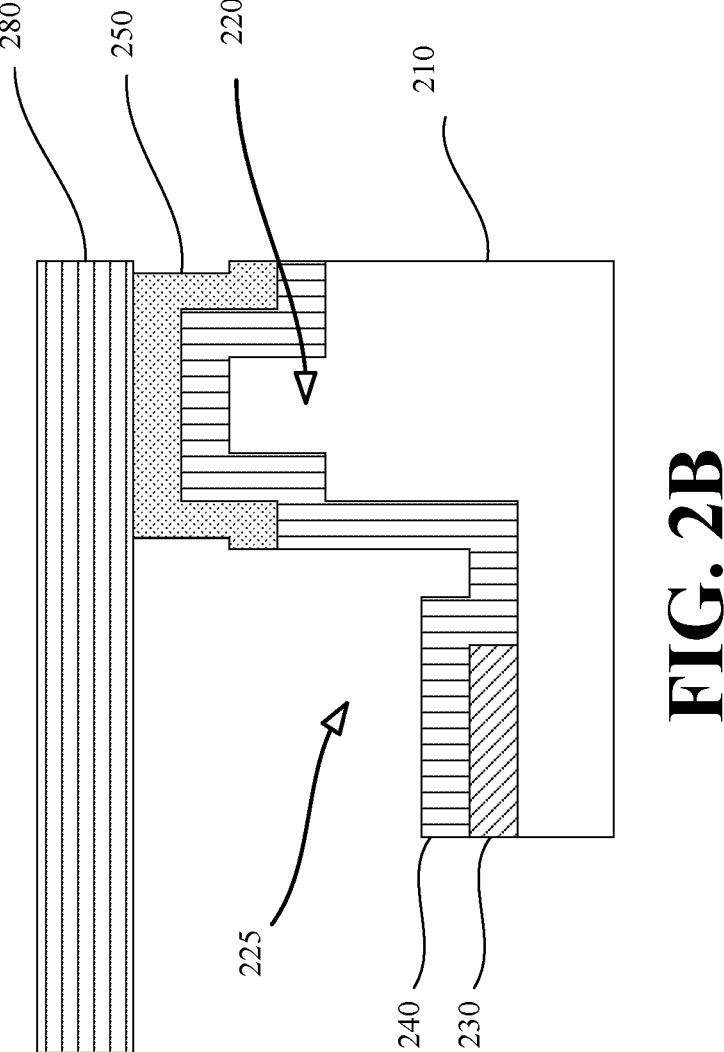
FIG. 2B is a cross-sectional schematic view of at least a portion of a monopolar electrostatic end effector, according to certain embodiments.
Figure 2B:
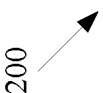
Figures 3A, 3B, 3C, 3D:
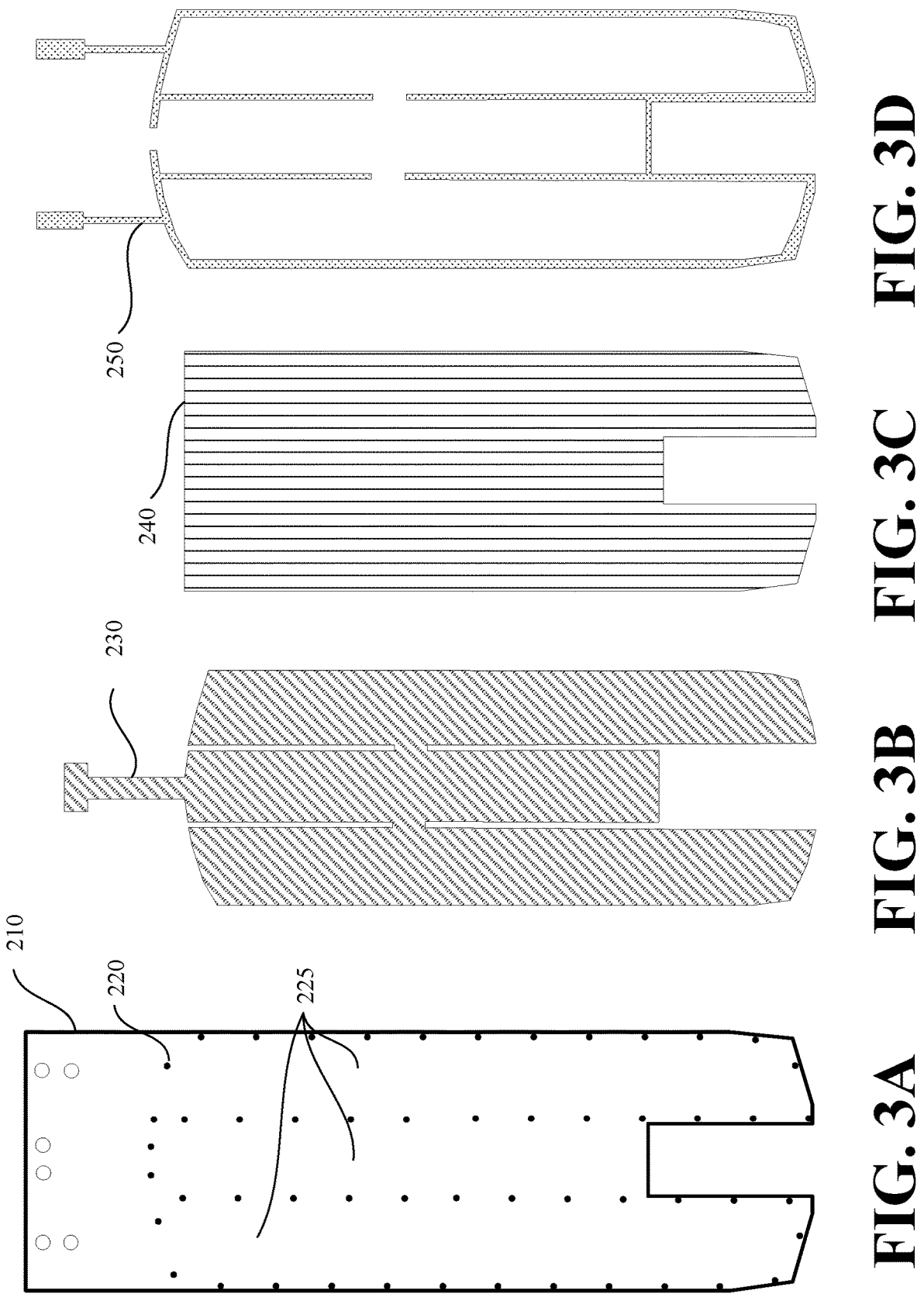
FIGS. 3A-D show a two-dimensional representation of one or more layers of a monopolar electrostatic end effector, according to certain embodiments.

FIG. 2B is a cross-sectional schematic view of at least a portion of a monopolar electrostatic end effector, according to certain embodiments. End effector base 210 may have one or more layers deposited on at least the top surface. In some embodiments, cathode layer 230, dielectric layer 240, and ground layer 250 are deposited upon end effector base 210. The cathode layer 230, dielectric layer 240, and ground layer 250 may be disposed within an outer border of the end effector base 210, the outer border being formed by the outer edges of the end effector base 210. The cathode layer 230 may be deposited in one or more valleys 225 of end effector base 210. The dielectric layer 240 may be deposited on top of the cathode layer 230 and extend up a sidewall of a valley 225 of the end effector base 210 and cover at least a surface of one or more pillars 220. The ground layer 250 may be deposited upon the dielectric layer 240 where the dielectric layer 240 covers one or more pillars 220. A substrate 280 may be positioned on top the ground layer 250. In some embodiments, each of the cathode layer 230, dielectric layer 240, and ground layer 250 are approximately 10 μm thick. In other embodiments, each of the cathode layer 230, dielectric layer 240, and ground layer 250 may be a thickness such that when a voltage is applied to the cathode layer 230, a desired resultant electrostatic attractive force is applied upon the substrate 280. In some embodiments, gap of approximately 60 μm exists between a top surface of the dielectric layer 240 and a bottom surface of the substrate 280. However, a smaller or larger gap may exist if an appropriate voltage is applied to the cathode layer 230 in order to create a desired resultant attractive electrostatic force. In some embodiments, the gap may be necessary to avoid glow discharge failures for particular environments or pressure ranges. Additionally, the gap may be tailored for a specific pressure range (e.g., smaller gap for a certain pressure, larger gap for a different pressure). In some embodiments, the gap is adjusted by the use of Piezo-Electric actuators causing the pillars to extend and/or retract vertically.

In some embodiments, end effector 200 may be used by a transfer chamber robot or a factory interface robot to transfer substrate in an electronic device manufacturing system (e.g., system 100). A substrate 280 may be transported by the end effector 200. While the end effector 200 is transporting the substrate 280, the substrate 280 may be positioned on top of ground layer 250. A voltage may be applied to the cathode layer 230, and the ground layer 250 may be grounded, thus creating an electrostatic force between the end effector 200 and the substrate 280. In some embodiments, the voltage applied to the cathode layer 230 is approximately 500 volts, but the voltage applied may be any required voltage to create the desired electrostatic force. The electrostatic force may act upon the substrate 280 so as to reduce or eliminate any slipping of the substrate 280 on the end effector 200 when the end effector 200 is under an acceleration condition. This electrostatic force thus allows for greater acceleration of the end effector 200 without the substrate 280 slipping.

FIGS. 3A-D show a top representation of one or more layers of a monopolar electrostatic end effector, according to certain embodiments. In some embodiments, the end effector base 210 includes pillars 220 and one or more valleys 225 substantially between the pillars. The cathode layer 230 may be deposited on the top surface of the end effector base 210 within the outer border of the end effector base 210. The dielectric layer 240 may be deposited on top of at least the cathode layer 230 and a top surface of the end effector base 210. The ground layer 250 may be deposited on top of at least the dielectric layer 240 and a top surface of the end effector base 210. The ground layer 250 may be deposited on the tops of the pillars 220 and may create a conductive path between each of the pillars 220.

Figure 4A:
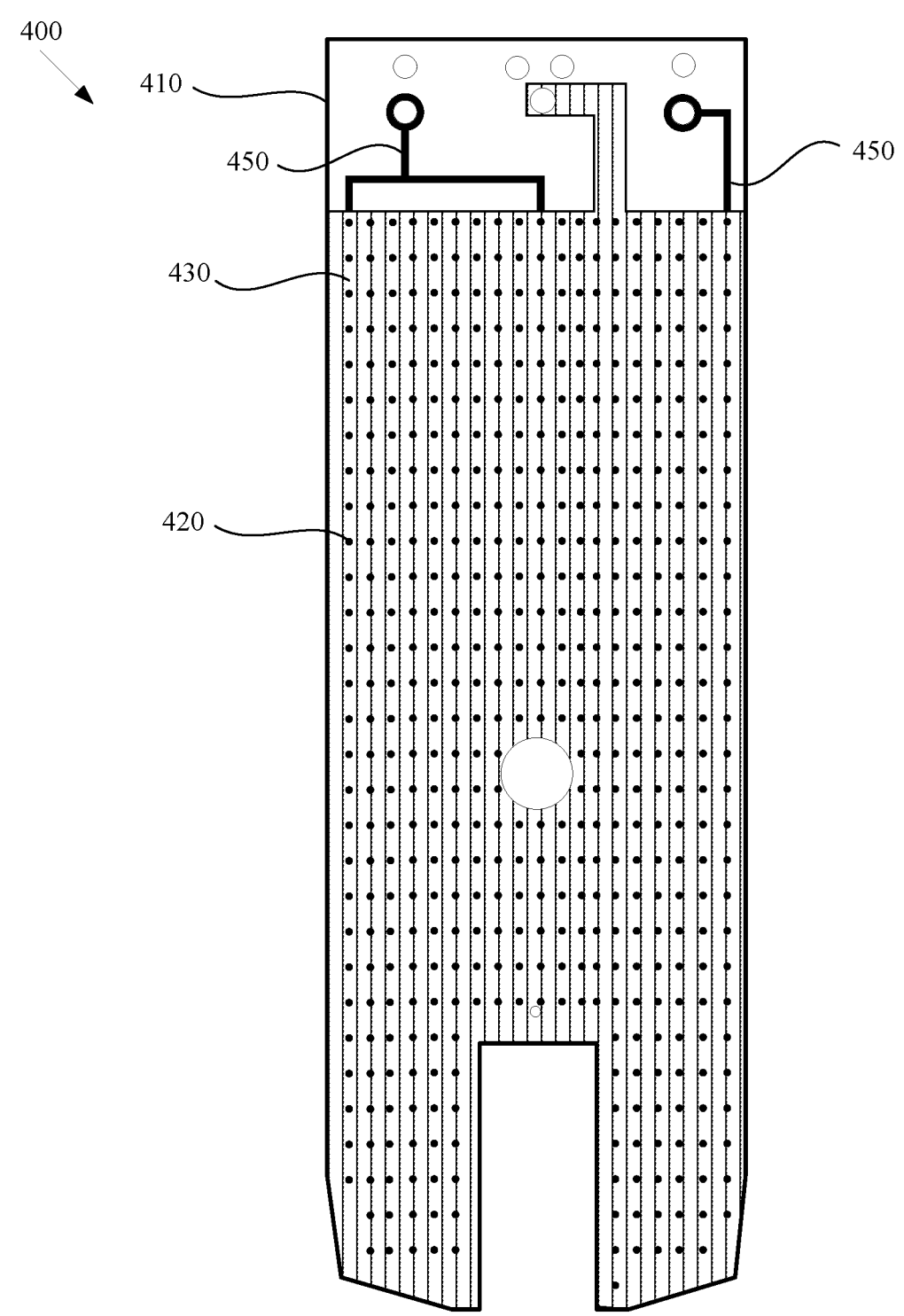
FIG. 4A is a top schematic cutaway view of a monopolar electrostatic end effector, according to certain embodiments.

FIG. 4A is a top schematic cutaway view of a monopolar electrostatic end effector, according to certain embodiments. In some embodiments, end effector 400 includes an end effector base 410. Multiple mesas 420 may be distributed about a top surface of the end effector base 410. In some embodiments, each of the mesas is approximately 10 μm tall. The end effector 400 may include one or more layers imbedded between one or more laminated sheets. The one or more laminated sheets may be a ceramic sheet. In some embodiments, the one or more embedded layers are coplanar. In other embodiments, the one or more layers are not coplanar. In some embodiments, the one or more laminated sheets are sheets of alumina. End effector 400 may include a cathode layer 430 between one or more laminated sheets disposed within an outer border of the end effector base 410 formed by the outer edges of the end effector base 410. The cathode layer 430 may comprise a conductive material. In some embodiments, the cathode layer 430 is a platinum layer. End effector 400 may also include a ground layer 450 between one or more laminated sheets. The ground layer 450 may comprise a conductive material. In some embodiments, the ground layer 450 is a platinum layer. In certain embodiments, the cathode layer 430 and the ground layer 450 are coplanar, but are electrically insulated from each other. In some embodiments, the cathode layer 430 and the ground layer 450 reside on different planes within the end effector body 410.

Figure 4B:
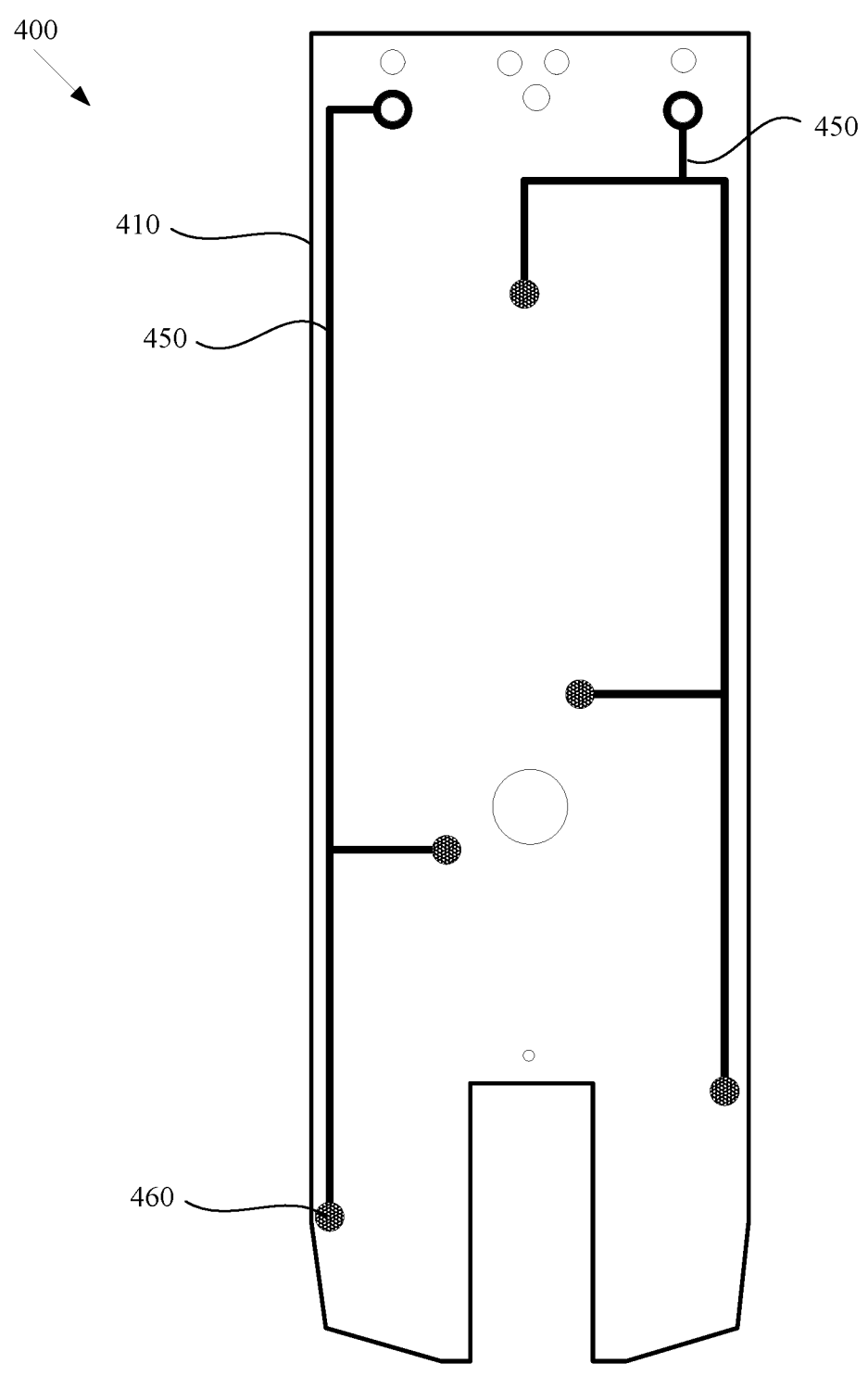
FIG. 4B is a bottom schematic cutaway view of a monopolar electrostatic end effector, according to certain embodiments.

FIG. 4B is a bottom schematic cutaway view of a monopolar electrostatic end effector, according to certain embodiments. End effector 400 may include the ground layer 450. The ground layer 450 may be embedded between one or more ceramic sheets and disposed within an outer border of the end effector base 410. In some embodiments, the ground layer 450 includes one or more traces which run within the end effector base 410. In other embodiments, the ground layer 450 is disposed over substantially an entire footprint of the end effector base 410. In certain embodiments, the ground layer 450 connects one or more ground pins 460. In certain embodiments, end effector 400 may have as few as three ground pins 460. In other embodiments, end effector 400 has five ground pins 460. (See FIG. 4C for an explanation of the ground pins 460).

Figure 4C:
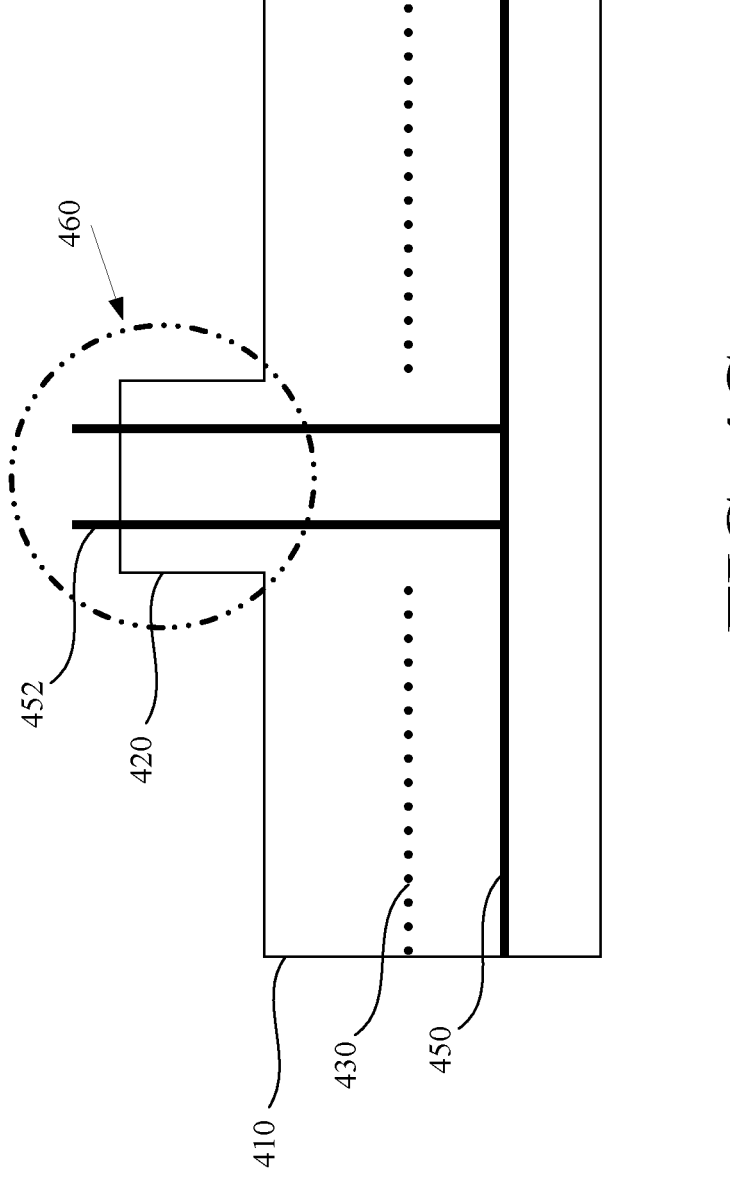
FIG. 4C is a cross-sectional schematic view of at least a portion of a monopolar electrostatic end effector, according to certain embodiments.

FIG. 4C is a cross-sectional schematic view of at least a portion of a monopolar electrostatic end effector, according to certain embodiments. In some embodiments, the ground layer 450 is disposed within the end effector base 410 beneath the cathode layer 430. The cathode layer 430 and the ground layer 450 are electrically insulated from one another.

End effector 400 may include multiple mesas 420 on a top surface of the end effector base 410. A ground pin 460 may include a mesa 420 and one or more ground protrusions 452. Each ground protrusion 452 may comprise a conductive material. For example, in some embodiments, each ground protrusion 452 is platinum. Ground protrusions 452 may rise above a top surface of mesa 420. In some embodiments, ground protrusions 452 rise two to three μm above a top surface of mesa 420.

In some embodiments, end effector 400 may be used by a transfer chamber robot or factory interface robot to transfer substrates in an electronic device manufacturing system. A substrate may be transported by the end effector 400. While the end effector 400 is transporting the substrate, the substrate sits on top of one or more mesas 420. A specific gap may exist between the bottom of the substrate and the cathode layer (e.g., 70 μm). The gap may be tailored for a specific pressure. In some embodiments, the gap may be adjusted by the use of Piezo-Electric actuators to vertically extend and/or retract the mesas 420. The substrate may make electrical contact with the one or more ground protrusions. A voltage may be applied to the cathode layer 430, while the ground layer 450 is grounded, thus creating an electrostatic force between the end effector 400 and the substrate. In some embodiments, the voltage applied to the cathode layer 430 is 500 volts, but the voltage applied may be any required voltage to create the desired electrostatic force. The electrostatic force may act upon the substrate so as to reduce or eliminate any slipping of the substrate on the end effector 400 when the end effector 400 is under an acceleration condition. This electrostatic force thus allows for greater acceleration of the end effector 400 without the substrate slipping.

Figure 5:
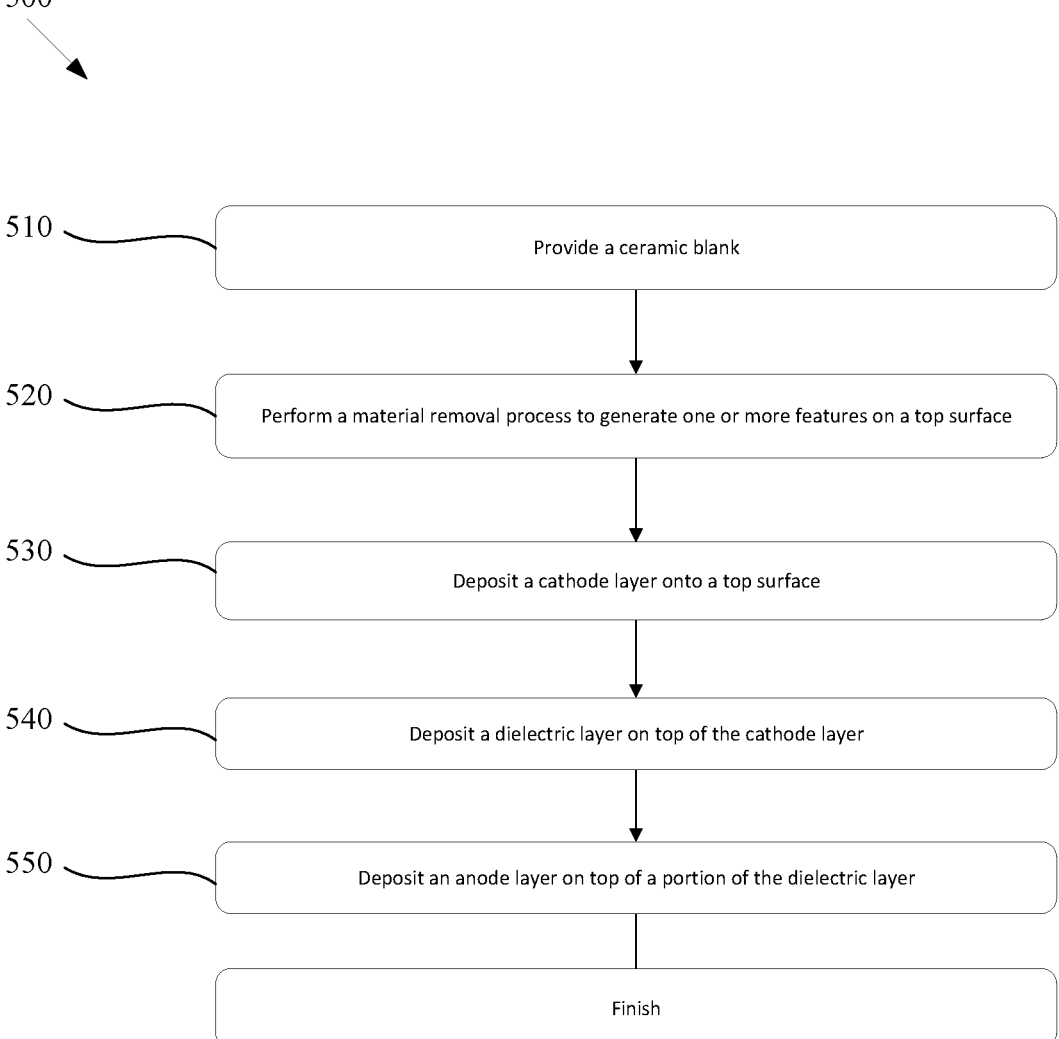
FIG. 5 is a flow chart of a method for manufacturing a monopolar electrostatic end effector, according to certain embodiments.

FIG. 5 is a flow chart for a method for manufacturing a monopolar electrostatic end effector, according to certain embodiments. Method 500 is performed by processing logic that may include hardware (circuitry, dedicated logic, etc.), software (such as is run on a general purpose computer system or a dedicated machine), firmware, or some combination thereof. In one implementation, method 500 may be performed by a computer system or a processing device not depicted in the figures. In other or similar implementations, one or more operations of method 500 may be performed by one or more other machines not depicted in the figures.

At operation 510, a ceramic blank is provided. In some embodiments, the ceramic blank is machined. In some embodiments, the ceramic blank has at least the approximate shape of an electrostatic end effector. In certain embodiments, the ceramic blank is of alumina.

At operation 520, the ceramic blank is subject to a material removal process to generate one or more features on the top surface of the ceramic blank. In some embodiments, the material removal process may comprise microbead blasting, or any another suitable material removal process capable of generating the top surface features on the ceramic blank. The material removal process may result in portions of the top surface of the ceramic blank being removed so that the work piece comprises multiple pillars and one or more valleys on a top surface of the end effector.

At operation 530, a cathode layer is deposited upon at least the top surface of the end effector by a deposition process. In some embodiments, the deposition process is a vapor deposition process. The cathode layer may be deposited on the surface of at least the one or more valleys of the end effector.

At operation 540, a dielectric layer may be deposited over a top surface of the end effector by a deposition process. The dielectric layer may cover the cathode layer.

At operation 550, an anode layer is deposited on the end effector. The anode lay may cover a portion of the dielectric layer. In some embodiments, the anode layer is deposited over the multiple pillars of the end effector.

Figure 6:
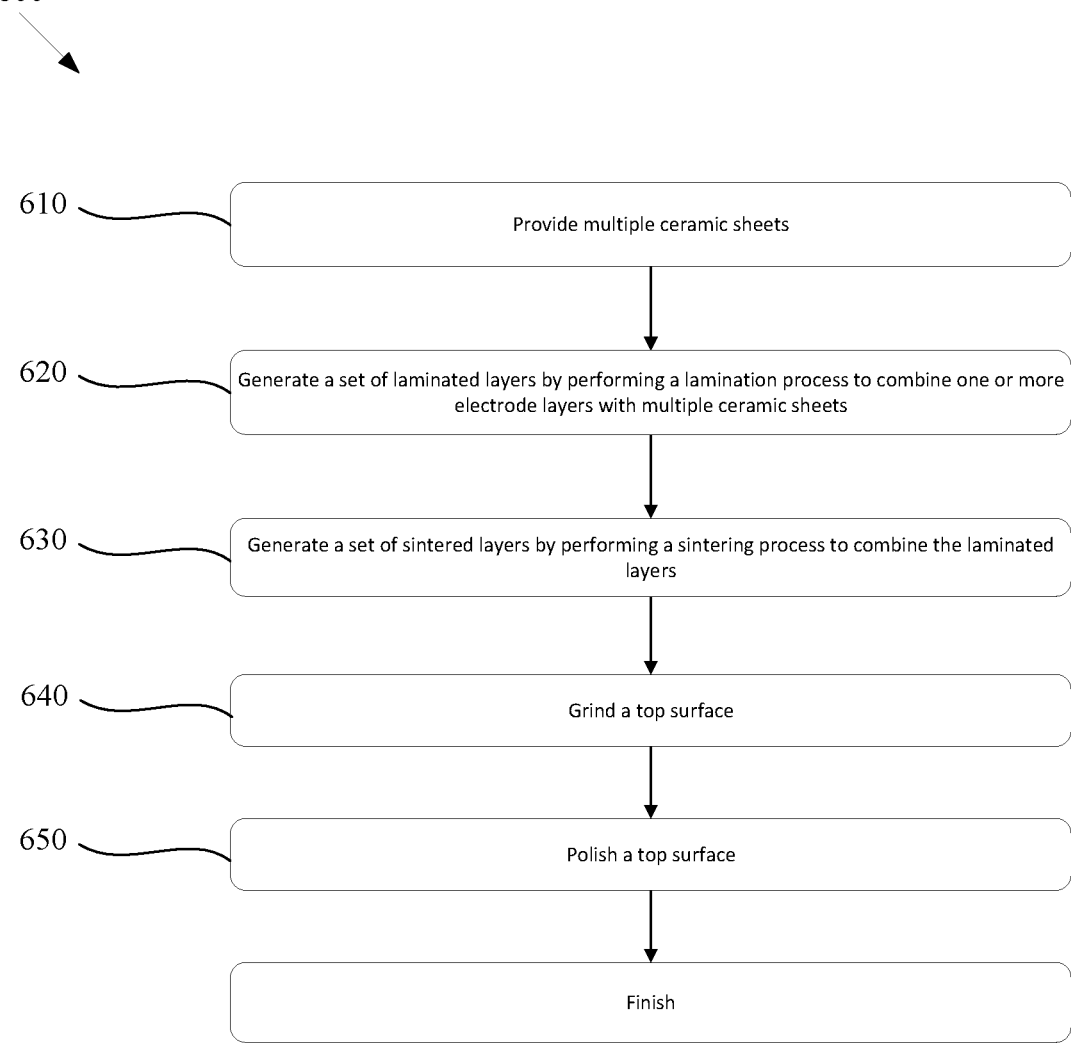
FIG. 6 is another flow chart of a method for manufacturing a monopolar electrostatic end effector, according to certain embodiments.

FIG. 6 is a flow chart for another method for manufacturing a monopolar electrostatic end effector, according to certain embodiments. Method 600 is performed by processing logic that may include hardware (circuitry, dedicated logic, etc.), software (such as is run on a general purpose computer system or a dedicated machine), firmware, or some combination thereof. In one implementation, method 600 may be performed by a computer system or a processing device not depicted in the figures. In other or similar implementations, one or more operations of method 600 may be performed by one or more other machines not depicted in the figures.

At operation 610, multiple ceramic sheets are provided, each ceramic sheet having an approximate outline of the finished end effector. In certain embodiments, the ceramic sheets are sheets of alumina. In some embodiments, the ceramic sheets are machined from stock.

At operation 620, a set of laminated layers are generated by performing a lamination process to combine one or more electrode layers with multiple ceramic. The one or more electrode layers may include at least an anode layer and a cathode layer. In some embodiments, the cathode layer and the anode layer are coplanar. In other embodiments, the cathode layer and the anode layer are disposed one above the other or vice versa.

At operation 630, a set of sintered layers is generated by performing a sintering process to combine the laminated layers. The sintering process may include exposing the laminated layers to a sufficiently high temperature in an oven so that the layers coalesce into a single mass.

At operation 640, a grinding operation may be performed on at least the top surface of the sintered end effector. The grinding operation may be accomplished using coarse abrasives. The grinding operation may leave the end effector with a roughly flat top surface.

At operation 650, the at least the top surface of the end effector may be polished by a polishing process. The polishing process may be accomplished using fine abrasives. As a result of the polishing process, the end effector may have a polished smooth top surface.

The preceding description sets forth numerous specific details such as examples of specific systems, components, methods, and so forth in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular implementations may vary from these exemplary details and still be contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

What is claimed is:

1. An electrostatic end effector comprising:
a ceramic base comprising a plurality of pillars configured to support a substrate;
a first electrode layer disposed between the plurality of pillars on a surface of the ceramic base;
a dielectric layer disposed on the first electrode layer and on the plurality of pillars; and
a second electrode layer disposed on a portion of the dielectric layer on the plurality of pillars, wherein the electrostatic end effector is configured to generate an electrostatic force upon the substrate responsive to a voltage being applied to the first electrode.

2. The electrostatic end effector of claim 1, wherein the plurality of pillars are arranged in rows on a top surface of the ceramic base.

3. The electrostatic end effector of claim 2, further comprising a plurality of valleys between the rows of the plurality of pillars, wherein the first electrode layer is deposited on at least one or more surfaces of the plurality of valleys.

4. The electrostatic end effector of claim 2, wherein the first electrode layer and the second electrode layer comprise titanium layers deposited by a physical vapor deposition process.

5. The electrostatic end effector of claim 2, wherein:
the dielectric layer is deposited substantially on top of the first electrode layer and the plurality of pillars; and
the second electrode layer is deposited substantially on top of the dielectric layer.

6. The electrostatic end effector of claim 1, wherein the ceramic base comprises a plurality of laminated sheets, and wherein the ceramic base electrically insulates the first electrode layer from the second electrode layer.

7. The electrostatic end effector of claim 6, wherein the first electrode layer and the second electrode layer are embedded within the plurality of laminated sheets.

8. The electrostatic end effector of claim 6, wherein the plurality of pillars comprise a plurality of mesas distributed across a top surface of the ceramic base, wherein the plurality of mesas are configured to support the substrate.

9. The electrostatic end effector of claim 8, wherein the first electrode layer and the second electrode layer are platinum layers, the second electrode layer being substantially disposed beneath the first electrode layer, and the second electrode layer comprises one or more protrusions that rise through and protrude from one or more mesas of the plurality of mesas.

10. A method of manufacturing an electrostatic end effector, the method comprising:
providing a ceramic blank;
performing a material removal process on the ceramic blank to generate one or more features on a top surface of the ceramic blank, wherein the one or more features comprise a plurality of pillars;
depositing a cathode layer onto at least a top surface of the ceramic blank between the plurality of pillars on a surface of the ceramic blank;
depositing a dielectric layer on top of at least the cathode layer and on top of the plurality of pillars; and
depositing an anode layer on top of at least a portion of the dielectric layer on the plurality of pillars.

11. The method of claim 10, wherein the plurality of pillars are arranged in rows on the top surface of the ceramic blank.

12. The method of claim 11, wherein the material removal process generates a plurality of valleys on the top surface of the ceramic blank between the rows of the plurality of pillars, wherein the cathode layer is deposited on one or more surfaces of the plurality of valleys.

13. The method of claim 10, wherein the cathode layer and the anode layer comprise titanium layers deposited by a physical vapor deposition process.

14. The method of claim 11, wherein:
the dielectric layer is deposited substantially on top of the cathode layer and the plurality of pillars; and
the anode layer is deposited substantially on top of the dielectric layer on top of the plurality of pillars.

15. The method of claim 10 wherein at least one of the cathode layer, the dielectric layer, or the anode layer are deposited by a physical vapor deposition process.

16. A method of manufacturing an electrostatic end effector, the method comprising:
providing a plurality of ceramic sheets;
generating a set of laminated layers by performing a lamination process to combine a cathode layer and a ground layer with the plurality of ceramic sheets, wherein the ground layer is disposed beneath the cathode layer within the set of laminated layers;
generating a set of sintered layers by performing a sintering process to combine the set of laminated layers;
grinding at least a top surface of the sintered layers; and
polishing at least the top surface of the sintered layers.

17. The method of claim 16, further comprising
performing a material removal process to generate a plurality of mesas on the top surface of the electrostatic end effector.

18. The method of claim 16, wherein at least one of the cathode layer or the ground layer is comprised of platinum.

19. The method of claim 16, wherein the cathode layer and the ground layer reside on different planes in the sintered layers.

20. The method of claim 17, wherein the ground layer comprises one or more protrusions that rise through and protrude from one or more mesas.

\* \* \* \* \*